(12) United States Patent
Neishi et al.

(10) Patent No.: US 8,859,421 B2
(45) Date of Patent: Oct. 14, 2014

(54) MANGANESE OXIDE FILM FORMING METHOD, SEMICONDUCTOR DEVICE MANUFACTURING METHOD AND SEMICONDUCTOR DEVICE

(75) Inventors: Koji Neishi, Sendai (JP); Junichi Koike, Nirasaki (JP); Kenji Matsumoto, Sendai (JP)

(73) Assignees: Tokyo Electron Limited, Tokyo (JP); Tohoku University, Miyagi (JP)

( * ) Notice: Subject to any disclaimer, the term of this patent is extended or adjusted under 35 U.S.C. 154(b) by 111 days.

(21) Appl. No.: 13/267,227

(22) Filed: Oct. 6, 2011

(65) Prior Publication Data
US 2012/0025380 A1 Feb. 2, 2012

Related U.S. Application Data

(63) Continuation of application No. PCT/JP2010/054975, filed on Mar. 23, 2010.

(30) Foreign Application Priority Data

Apr. 8, 2009 (JP) .................................. 2009-093549

(51) Int. Cl.
| | |
|---|---|
| H01L 21/44 | (2006.01) |
| H01L 21/4763 | (2006.01) |
| H01L 23/48 | (2006.01) |
| H01L 23/52 | (2006.01) |
| H01L 29/40 | (2006.01) |
| H01L 23/532 | (2006.01) |
| H01L 21/768 | (2006.01) |
| C23C 16/40 | (2006.01) |

(52) U.S. Cl.
CPC .... H01L 23/53238 (2013.01); H01L 21/76867 (2013.01); *H01L 21/76843* (2013.01); *C23C 16/40* (2013.01); *C23C 16/401* (2013.01); *C23C 16/406* (2013.01); H01L 21/76831 (2013.01); H01L 21/76844 (2013.01); *H01L 2924/12044* (2013.01)
USPC ........... 438/653; 438/652; 438/654; 438/626; 438/627; 257/751

(58) Field of Classification Search
CPC .................. H01L 21/79844; H01L 21/76867; H01L 21/76843; H01L 23/53238
USPC ........... 438/627, 628, 652, 653, 654; 257/751
See application file for complete search history.

(56) References Cited

U.S. PATENT DOCUMENTS

| | | | | | |
|---|---|---|---|---|---|
| 4,963,394 | A | * | 10/1990 | Willer | 427/250 |
| 5,487,356 | A | * | 1/1996 | Li et al. | 117/99 |

(Continued)

FOREIGN PATENT DOCUMENTS

| | | |
|---|---|---|
| JP | 2007-067107 A | 3/2007 |
| JP | 2007-220738 A | 3/2007 |

(Continued)

OTHER PUBLICATIONS

International Search Report for PCT/JP2010/054975 dated Jul. 6, 2010.

*Primary Examiner* — Karen Kusumakar
(74) *Attorney, Agent, or Firm* — Pearne & Gordon LLP

(57) ABSTRACT

There is provided a manganese oxide film forming method capable of forming a manganese oxide film having high adhesivity to Cu. In the manganese oxide film forming method, a manganese oxide film is formed on an oxide by supplying a manganese-containing gas onto the oxide. A film forming temperature for forming the manganese oxide film is set to be equal to or higher than about 100° C. and lower than about 400° C.

18 Claims, 13 Drawing Sheets

(56) References Cited

U.S. PATENT DOCUMENTS

| | | |
|---|---|---|
| 7,304,384 B2 * | 12/2007 | Koike et al. .................... 257/751 |
| 7,391,115 B2 * | 6/2008 | Usami et al. .................... 257/760 |
| 2004/0121074 A1 * | 6/2004 | Zhuang et al. ............ 427/255.32 |
| 2004/0170761 A1 * | 9/2004 | Li et al. .................... 427/255.28 |
| 2005/0266186 A1 * | 12/2005 | Nguyen et al. ............. 428/32.77 |
| 2006/0141155 A1 * | 6/2006 | Gordon et al. ............ 427/255.19 |
| 2007/0048931 A1 * | 3/2007 | Shimizu et al. ............ 438/243 |
| 2008/0042281 A1 | 2/2008 | Abe |
| 2009/0146309 A1 * | 6/2009 | Kudo et al. .................... 257/768 |
| 2009/0236745 A1 * | 9/2009 | Vrtis et al. .................... 257/751 |
| 2010/0140802 A1 | 6/2010 | Matsumoto et al. |
| 2011/0139272 A1 * | 6/2011 | Matsumoto et al. .......... 137/511 |

FOREIGN PATENT DOCUMENTS

| | | |
|---|---|---|
| JP | 2008-028046 A | 2/2008 |
| JP | 2008-047675 A | 2/2008 |
| JP | 2009-016782 A | 1/2009 |
| TW | 200915400 A | 4/2009 |
| WO | 2008/149844 A1 | 12/2008 |
| WO | WO 2009/028619 * | 3/2009 |

* cited by examiner

*FIG. 4*

|  | 100°C | 200°C | 300°C | 400°C |
|---|---|---|---|---|
| As-dep., in-situ Cu | good | good | good | poor |
| After annealing, in-situ Cu | good | good | good | poor |

MANGANESE OXIDE FILM FORMING METHOD, SEMICONDUCTOR DEVICE MANUFACTURING METHOD AND SEMICONDUCTOR DEVICE

CROSS-REFERENCE TO RELATED APPLICATION

This application is a Continuation of International Application No. PCT/JP2010/054975 filed on Mar. 23, 2010, which claims the benefits of Japanese Patent Application No. 2009-093549 filed on Apr. 8, 2009. The entire disclosure of the prior application is incorporated herein by reference in its entirety.

FIELD OF THE INVENTION

The present disclosure relates to a manganese oxide film forming method; a semiconductor device manufacturing method using the manganese oxide film forming method; and a semiconductor device manufactured by the semiconductor device manufacturing method.

BACKGROUND OF THE INVENTION

With the increase of integration density of a semiconductor device, a geometric dimension of the semiconductor device or an internal wiring thereof is getting more miniaturized. Resistance of the internal wiring such as copper (Cu) wiring increases as the geometrical dimension of the Cu wiring decreases. In order to reduce such an increase of resistance, combined resistance of the barrier layer and the Cu wiring needs to be reduced by decreasing a thickness of a diffusion barrier film (hereinafter, simply referred to as a "barrier layer") for preventing a diffusion of Cu.

The barrier layer is formed by using a PVD method (sputtering method), as described in Japanese Patent Laid-open Publication No. 2008-028046, for example.

BRIEF SUMMARY OF THE INVENTION

In a thin barrier layer formed by the PVD method, however, if a geometric dimension of a Cu wiring decreases to, e.g., about 45 nm or below, a step coverage of a recess for burying therein the Cu wiring becomes deteriorated. Thus, it is getting difficult to form a thinner barrier layer by using the PVD method.

In contrast, attention has been drawn to a CVD method as a new method for forming a barrier layer since it provides a better step coverage over a recess, as compared to the PVD method. Especially, the present inventor has discovered that a manganese oxide film formed by the CVD method has a fine step coverage over a minute recess even when its thickness is small. The manganese oxide film formed by the CVD method is one of strong candidates for a new barrier layer material.

Further, the present inventor has also discovered that adhesivity between the manganese oxide film formed by the CVD method and Cu depends on a film forming temperature for forming the manganese oxide film.

The present disclosure provides a manganese oxide film forming method capable of forming a manganese oxide film having high adhesivity to Cu; a semiconductor device manufacturing method using the manganese film forming method; and a semiconductor device manufactured by the semiconductor device manufacturing method.

In accordance with one aspect of the present disclosure, there is provided a manganese oxide film forming method for forming a manganese oxide film on an oxide by supplying a manganese-containing gas onto the oxide. The method may include setting a film forming temperature for forming the manganese oxide film to be equal to or higher than about 100° C. and lower than about 400° C.

In accordance with another aspect of the present disclosure, there is provided a semiconductor device manufacturing method including forming an interlayer insulating film having an oxide on a substrate; forming a recess in the interlayer insulating film; forming a manganese oxide film on the interlayer insulating film by supplying a manganese-containing gas onto the interlayer insulting film having the recess at a film forming temperature equal to or higher than about 100° C. and lower than about 400° C.; and depositing a conductive material in the recess of the interlayer insulating film on which the manganese oxide film is formed in order to form an internal wiring.

In accordance with still another aspect of the present disclosure, there is provided a semiconductor device having a diffusion barrier layer containing manganese, oxygen, and carbon. A peak concentration of the carbon in the diffusion barrier layer may be equal to or smaller than about $3 \times 10^{22}$ atoms/cm$^3$, more desirably, may be equal to or smaller than about $1 \times 10^{22}$ atoms/cm$^3$.

In accordance with sill another aspect of the present disclosure, there is provided a semiconductor device having a diffusion barrier layer containing manganese, oxygen, and carbon. A ratio between a carbon concentration and a manganese concentration in a manganese oxide film of the diffusion barrier layer may be equal to or smaller than about 1:1.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 4 is a table showing a result of a taping test;

DETAILED DESCRIPTION OF THE INVENTION

Figure 1:
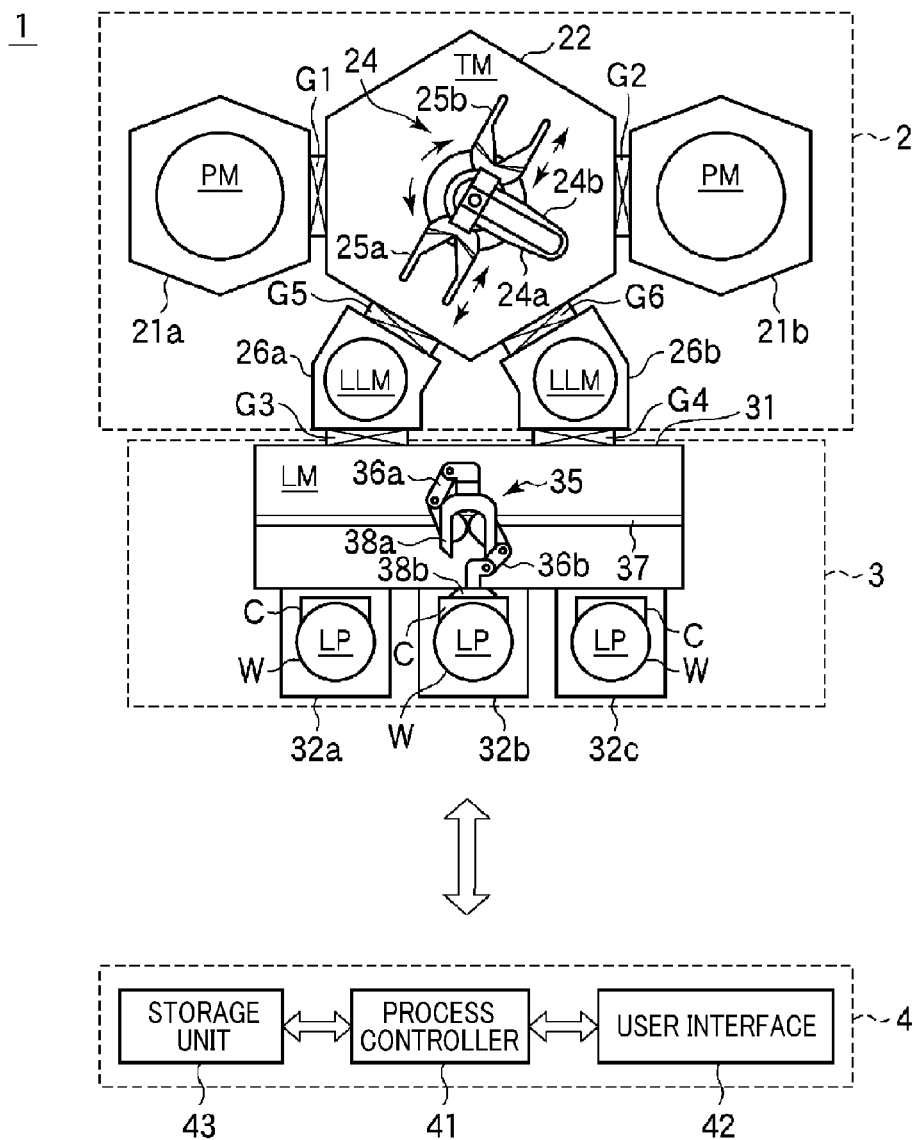
FIG. 1 is a plane view schematically illustrating an example of a film forming system capable of performing a manganese oxide film forming method in accordance with an embodiment of the present disclosure.

Hereinafter, embodiments of the present disclosure will be described with reference to the accompanying drawings. Throughout the drawings, same parts will be assigned same reference numerals.

(System Configuration)

FIG. 1 is a plane view schematically illustrating an example film forming system capable of performing a manganese oxide film forming method in accordance with an embodiment of the present disclosure. In the present embodiment, there is illustrated a film forming system used to manufacture a semiconductor device and configured to perform a film forming process on, e.g., a semiconductor wafer (hereinafter, simply referred to as a "wafer") serving as a substrate. However, the present disclosure may not be limited to the manganese oxide film formation on the wafer.

As shown in FIG. 1, a film forming system 1 may include a processing unit 2 for performing a process on a wafer W; a loading/unloading unit 3 for loading and unloading the wafer W into/from the processing unit 2; and a control unit 4 for controlling the apparatus 1. In accordance with the present embodiment, the film forming system 1 may be configured as a cluster-tool type (multi-chamber type) semiconductor manufacturing apparatus.

The processing unit 2 may include, for example, two processing chambers (PM) 21a and 21b for performing a process on the wafer W. An inside of each of the processing chambers 21a and 21b may be depressurized to a certain vacuum level. In the processing chamber 21a, a CVD film forming process of a manganese oxide film may be performed on the wafer W. In the processing chamber 21b, a PVD film forming process, e.g., a sputtering process, of copper or a copper alloy may be performed. The processing chambers 21a and 21b may be connected to a transfer chamber (TM) 22 via gate valves G1 and G2, respectively.

The loading/unloading unit 3 may include a loading/unloading chamber (LM) 31. The loading/unloading chamber 31 may be configured to be capable of adjusting an internal pressure thereof to be an atmospheric pressure or a substantially atmospheric pressure (e.g., a slightly positive pressure with respect to an atmospheric pressure). In the present embodiment, when viewed from the top, the loading/unloading chamber 31 may have a rectangular shape having two long sides and two short sides orthogonal to the long sides. One of the long sides may be adjacent to the processing unit 2. The loading/unloading chamber 31 may include load ports (LP) each equipped with a carrier C in which wafers W may be accommodated. In the present embodiment, three load ports 32a, 32b, and 32c may be provided along the other long side (opposite to the processing unit 2) of the loading/unloading chamber 31. Although the three load ports may be provided in the present embodiment, the number of the load ports may not be limited thereto but can be arbitrarily set. Each of the load ports 32a to 32c may have a non-illustrated shutter. When a carrier C accommodating therein wafers W or an empty carrier C is loaded in each of the load port 32a to 32c, the non-illustrated shutter may be moved to prevent an introduction of external air, and the inside of the carrier C may communicates with the inside of the loading/unloading chamber 31.

Load lock chambers (LLM) may be provided between the processing unit 2 and the loading/unloading unit 3. In the present embodiment, two load lock chambers 26a and 26b are provided. Each of the load lock chambers 26a and 26b may be configured to be capable of switching an internal pressure thereof between a certain vacuum level and an atmospheric pressure or a substantially atmospheric pressure. The load lock chambers 26a and 26b may be connected via gate valves G3 and G4, respectively, to one side of the loading/unloading chamber 31. The one side is opposite to the other side equipped with the load ports 32a to 32c. Further, the load lock chambers 26a and 26b may be connected to the transfer chamber 22's two sides other than the two sides where the processing chambers 21a and 21b are connected. By opening the corresponding gate valve G3 or G4, the load lock chamber 26a or 26b may communicate with the loading/unloading chamber 31. By closing the gate valve G3 or G4, the load lock chamber 21a or 21b may be isolated from the loading/unloading chamber 31. Furthermore, by opening a corresponding gate valve G5 or G6, the loading lock chamber 21a or 21b may communicate with the transfer chamber 22. By closing the gate valve G5 or G6, the load lock chamber 21a or 21b may be isolated from the transfer chamber 22.

A loading/unloading device 35 may be provided within the loading/unloading chamber 31. The loading/unloading device 35 may load and unload a wafer W into/from the carrier C for target substrates, and also may load and unload the wafer W into/from the load lock chambers 26a and 26b. The loading/unloading device 35 may include, e.g., two multi-joint arms 36a and 36b, and may be configured to move along a rail 37 extended in a lengthwise direction of the loading/unloading chamber 31. Hands 38a and 38b may be provided at front ends of the multi-joint arms 36a and 36b, respectively. The wafer W may be held on the hand 38a or 38b, and loaded and unloaded as described above.

The transfer chamber 22 may be configured as, for example, a vacuum chamber capable of maintaining a vacuum therein. A transfer device 24 may be provided within the transfer chamber 22 in order to transfer a wafer W between the processing chambers 21a and 21b and the load lock chambers 26a and 26b. The wafer W may be transferred while being isolated from the atmosphere. The transfer device 24 may be located at a substantially central portion of the transfer chamber 22. The transfer device 24 may have, e.g., a multiple number of transfer arms configured to be rotatable, extensible and contractible. In the present embodiment, by way of example, the transfer device 24 may have two transfer arms 24a and 24b. Holders 25a and 25b may be provided at front ends of the transfer arms 24a and 24b, respectively. The wafer W may be held by the holder 25a or 25b, and transferred between the processing chambers 21a and 21b and the load lock chambers 26a and 26b, as described above.

The control unit 4 may include a process controller 41, a user interface 42, and a storage unit 43.

The process controller 41 may include a microprocessor (computer).

The user interface 42 may include a keyboard through which an operator inputs commands to manage the film forming system 1, a display which visualizes and displays an operational status of the film forming system 1 or the like.

The storage unit 43 may store therein a control program for performing a process of the film forming system 1 under the control of the controller 41, various data and recipes for performing the process of the film forming system 1 according to processing conditions. The recipes may be stored in a computer-readable storage medium within the storage unit 43. By way of example, the computer-readable storage medium may include a hard disk or a portable device such as a CD-ROM, a DVD, or a flash memory. Furthermore, the recipes may be appropriately transmitted from another apparatus via, e.g., a dedicated line. A required recipe may be retrieved from the storage unit 43 in response to an instruction from the user interface 42 or the like and executed by the process controller 41, so that the process may be performed on the wafer W under the control of the process controller 41.

(Manganese Oxide CVD Apparatus)

Now, an example of a manganese oxide CVD apparatus will be explained. The manganese oxide CVD apparatus is installed at the position of the processing chamber 21a in accordance with the present embodiment.

Figure 2:
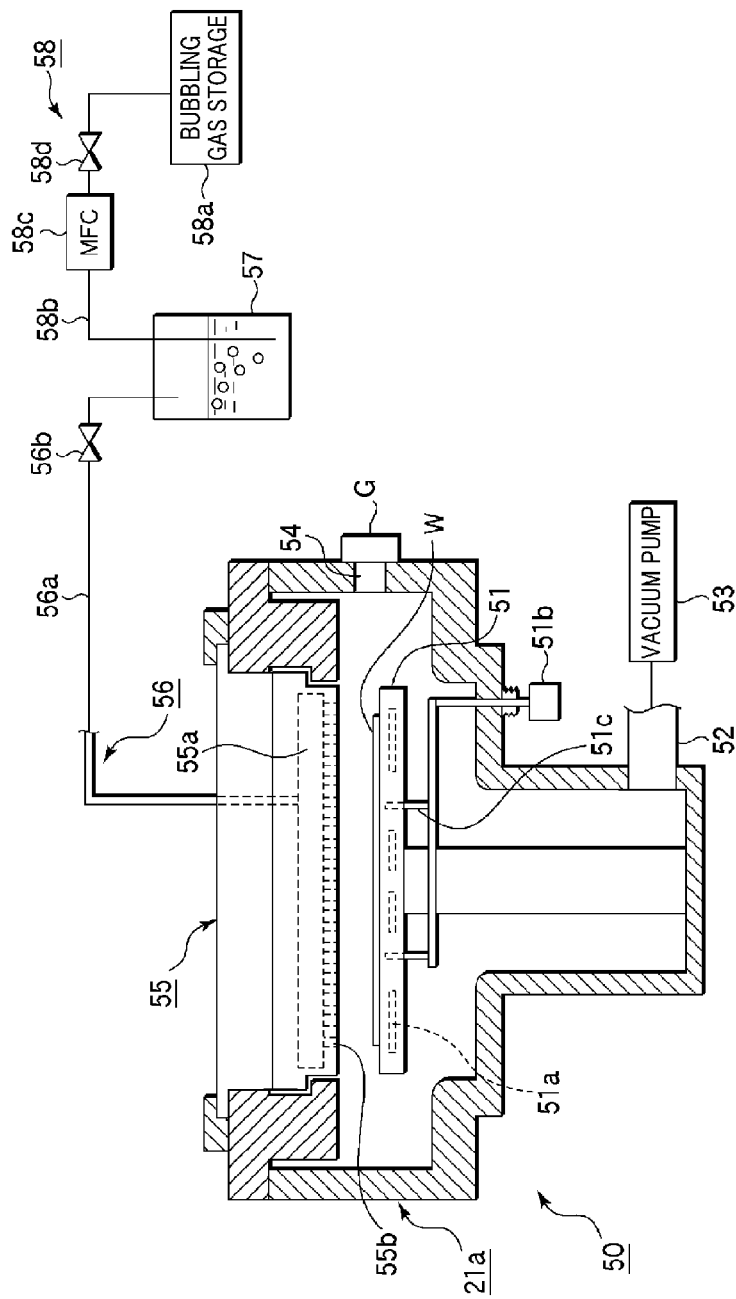
FIG. 2 is a cross sectional view schematically illustrating an example of a manganese oxide film forming apparatus in accordance with an embodiment of the present disclosure.

FIG. 2 is a cross sectional view schematically illustrating an example of a manganese oxide CVD apparatus.

As shown in FIG. 2, a manganese oxide CVD apparatus 50 may include the processing chamber 21a. A mounting table for horizontally mounting a wafer W thereon may be provided within the processing chamber 21a. A heater 51a serving as a temperature control unit for the wafer W may be embedded in the mounting table 51. Further, at the mounting table 51, three elevating pins 51c (only two of which are illustrated for the simplicity of illustration) that can be moved up and down by an elevating device 51b may be provided. The wafer W may be transferred between a non-illustrated wafer transfer device and the mounting table 51 via the elevating pins 51c.

One end of a gas exhaust pipe 52 may be connected to a bottom portion of the processing chamber 21a. The other end of the gas exhaust pipe 52 may be connected with a vacuum pump 53. Further, a transfer port 54 may be provided in a sidewall of the processing chamber 21a. The transfer port 54 can be opened and closed by a gate valve G.

A gas shower head 55 may be provided at a ceiling of the processing chamber 21a so as to face the mounting table 51. The gas shower head 55 may include a gas room 55a. A gas introduced into the gas room 55a may be supplied into the processing chamber 21a through a multiple number of gas discharge holes 55b.

The gas shower head 55 may be connected with a Mn source gas supply line system 56 for introducing an organic compound gas including manganese into the gas room 55a.

The Mn source gas supply line system 56 may include a source gas supply line 56a, and a source storage 57 is connected to an upstream side of the source gas supply line 56a. A manganese-containing organic compound, such as $(EtCp)_2Mn$ (bis(ethylcyclopentadienyl)manganese), may be stored in the source storage 57 in a liquid phase. The source storage 57 may be connected with a bubbling device 58.

The bubbling device 58 may include, by way of example, a bubbling gas storage 58a storing a bubbling gas therein; a supply line 58b for supplying the bubbling gas into the source storage 57; and a mass flow controller (MFC) 58c and a valve 58d for controlling a flow rate of the bubbling gas flowing in the supply line 58b. The bubbling gas may be, for example, an argon (Ar) gas or a hydrogen ($H_2$) gas. One end of the supply line 58b may be submerged in a source liquid (i.e., $(EtCp)_2Mn$ in the present embodiment) stored in the source storage 57. By jetting the bubbling gas from the supply line 58b, the source liquid may be bubbled and vaporized. The vaporized source liquid (Mn source gas) (i.e., vaporized $(EtCp)_2Mn$ in the present embodiment) may be supplied into the gas room 55a of the gas shower head 55 via the source gas supply line 56a and the valve 56b that opens and closes the source gas supply line 56a.

Here, a supply method for the Mn source gas may not be limited to the above-described bubbling method for bubbling and vaporizing the source liquid. By way of example, there may be employed a so-called liquid transport method for transporting a source liquid to a vaporizer and vaporizing the source liquid by the vaporizer.

In accordance with the manganese oxide CVD apparatus as described above, by supplying the gas of the manganese-containing organic compound, e.g., the gas of $(EtCp)_2Mn$, a manganese oxide film can be formed on a surface of the wafer W.

Further, in the manganese oxide CVD apparatus 50, $(EtCp)_2Mn[=Mn(C_2H_5C_5H_4)_2]$ is used as the manganese-containing organic compound. However, besides the $(EtCp)_2Mn$, the manganese-containing organic compound may include at least one organic compound selected from a group consisting of:

$Cp_2Mn[=Mn(C_5H_5)_2]$;
$(MeCp)_2Mn[=Mn(CH_3C_5H_4)_2]$;
$(i-PrCp)_2Mn[=Mn(C_3H_7C_5H_4)_2]$;
$MeCpMn(CO)_3[=(CH_3C_5H_4)Mn(CO)_3]$;
$(t-BuCp)_2Mn[=Mn (C_4H_9C_5H_4)_2]$;
$CH_3Mn(CO)_5$, $Mn(DPM)_3[=Mn(C_{11}H_{19}O_2)_3]$;
$Mn(DMPD)(EtCp)[=Mn(C_7H_{11}C_2H_5C_5H_4)]$;
$Mn(DPM)_2[=Mn(C_{11}H_{19}O_2)_2]$;

Mn(acac)$_2$[=Mn(C$_5$H$_7$O$_2$)$_2$];
Mn(acac)$_3$[=Mn(C$_5$H$_7$O$_2$)$_3$];
Mn(hfac)$_2$[=Mn(C$_5$HF$_6$O$_2$)$_3$];
((CH$_3$)$_5$Cp)$_2$Mn[=Mn((CH$_3$)$_5$C$_5$H$_4$)$_2$]; and
Mn(t-BuNC(CH$_3$)Nt—Bu)$_2$[=Mn(C$_4$H$_9$NC(CH$_3$)NC$_4$H$_9$)$_2$], which is a manganese acetamidinate compound.

(Sample Formation)

Figure 3A:
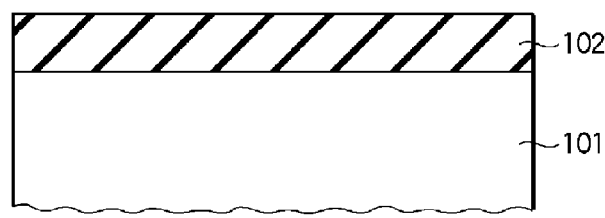
FIG. 3A is a cross sectional view illustrating a sample formed by the manganese oxide film forming method in accordance with the embodiment of the present disclosure.
Figure 3B:
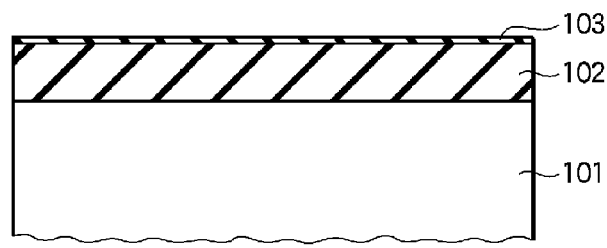
FIG. 3B is a cross sectional view illustrating the sample formed by the manganese oxide film forming method in accordance with the embodiment of the present disclosure.
Figure 3C:
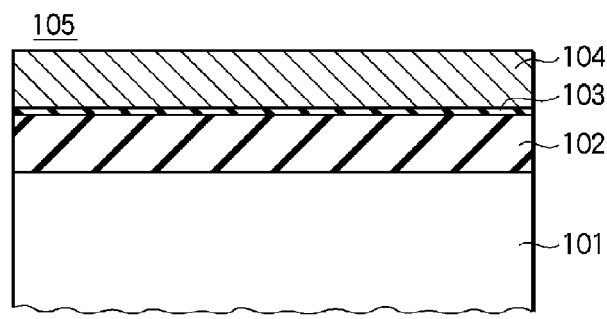
FIG. 3C is a cross sectional view illustrating the sample formed by the manganese oxide film forming method in accordance with the embodiment of the present disclosure.

FIGS. 3A to 3C are cross sectional views illustrating a sample formed by the manganese oxide film forming method in accordance with the embodiment of the present disclosure.

As depicted in FIG. 3A, by using a plasma CVD method, a plasma TEOS film (silicon oxide film) 102 having a thickness of about 100 nm may be formed on a p-type silicon wafer 101 serving as a substrate. Then, the wafer 101 having the plasma TEOS film 102 thereon may be transferred into the processing chamber 21a of the film forming system 1 shown in FIG. 1.

Thereafter, (EtCp)$_2$Mn[=Mn(C$_2$H$_5$C$_5$H$_4$)$_2$] which is a manganese-containing organic compound, may be vaporized at a temperature of, e.g., about 80° C., so that a gas of the manganese-containing organic compound may be produced. Then, the gas of the manganese-containing organic compound may be supplied into the processing chamber 21a along with, e.g., a H$_2$ gas used as a carrier gas. Then, as shown in FIG. 3B, a manganese oxide film 103 may be formed on the plasma TEOS film 102 by a thermal CVD method. Here, oxygen and/or moisture in the plasma TEOS film 102 may be used as an oxidizing agent for manganese, i.e., as an oxidizing agent for the manganese oxide film 103. Thereafter, the wafer 101 having thereon the manganese oxide film 103 may be transferred into the processing chamber 21b through the transfer chamber 22 of the film forming system 1 shown in FIG. 1.

Subsequently, as illustrated in FIG. 3C, a copper film 104 having a thickness of about 100 nm may be formed on the manganese oxide film 103 by a PVD method, such as a sputtering method. In this way, the formation of a sample 105 may be completed. Here, the copper film 104 may be formed by a CVD method, not by the PVD method. Further, it may be also possible to form the copper film 104 by forming a thin copper film (seed layer) by the PVD method and then plating a thick copper film on the thin copper film through the use of an electroplating method or an electroless plating method.

In the present embodiment, a film forming temperature for forming the manganese oxide film is set to be about 100° C., 200° C., 300° C., and 400° C. Two samples 105 are formed at each of these film forming temperatures, so that a total of eight samples 105 are fabricated.

Further, for four samples 105 fabricated at the film forming temperatures of 100° C., 200° C., 300° C., and 400° C., annealing process is additionally performed at a temperature of about 400° C. for about 100 hours. The annealing is performed in, for example, an argon (Ar) atmosphere.

(Adhesivity Test)

A test of adhesivity between the copper film 104 and the manganese oxide film 103 is performed for each of the eight samples 105. A peeling-off test was performed to test the adhesivity, and a taping test is used as the peeling-off test. The taping test may involve forming a multiple number of scratches on a surface of the copper film 104 in a lattice pattern with a diamond pen or the like in advance; attaching an adhesive tape on the copper film 104; and then detaching the tape from the copper film 104. Through this taping test, adhesivity of the copper film 104 can be investigated.

In the present embodiment, attachment/detachment of the tape is repeated ten times, and it is investigated whether the copper film 104 is peeled off. FIG. 4 provides results of the taping test.

As shown in FIG. 4, when the film forming temperature for forming the manganese oxide film 103 is set to be about 100° C., about 200° C., and about 300° C., it is found that the copper film 104 is not peeled off in the taping test (good) in both cases of performing the annealing process (After annealing, In-situ Cu) and not performing the annealing process (As-dep., In-situ Cu).

Meanwhile, when the film forming temperature for forming the manganese oxide film 103 is set to be about 400° C., the copper film 104 is peeled off (poor) before completing the attachment/detachment of the tape ten times in the both cases of performing and not performing the annealing process.

As can be seen from this taping test result, by setting the film forming temperature for forming the manganese oxide film 103 to be equal to or higher than about 100° C. and lower than about 400° C., it may be possible to form the manganese oxide film 103 having improved adhesivity to Cu and implement the film forming method, as compared to the case of forming a manganese oxide film at a temperature equal to or higher than about 400° C.

(Analysis of the Manganese Oxide Film)

Figure 5:
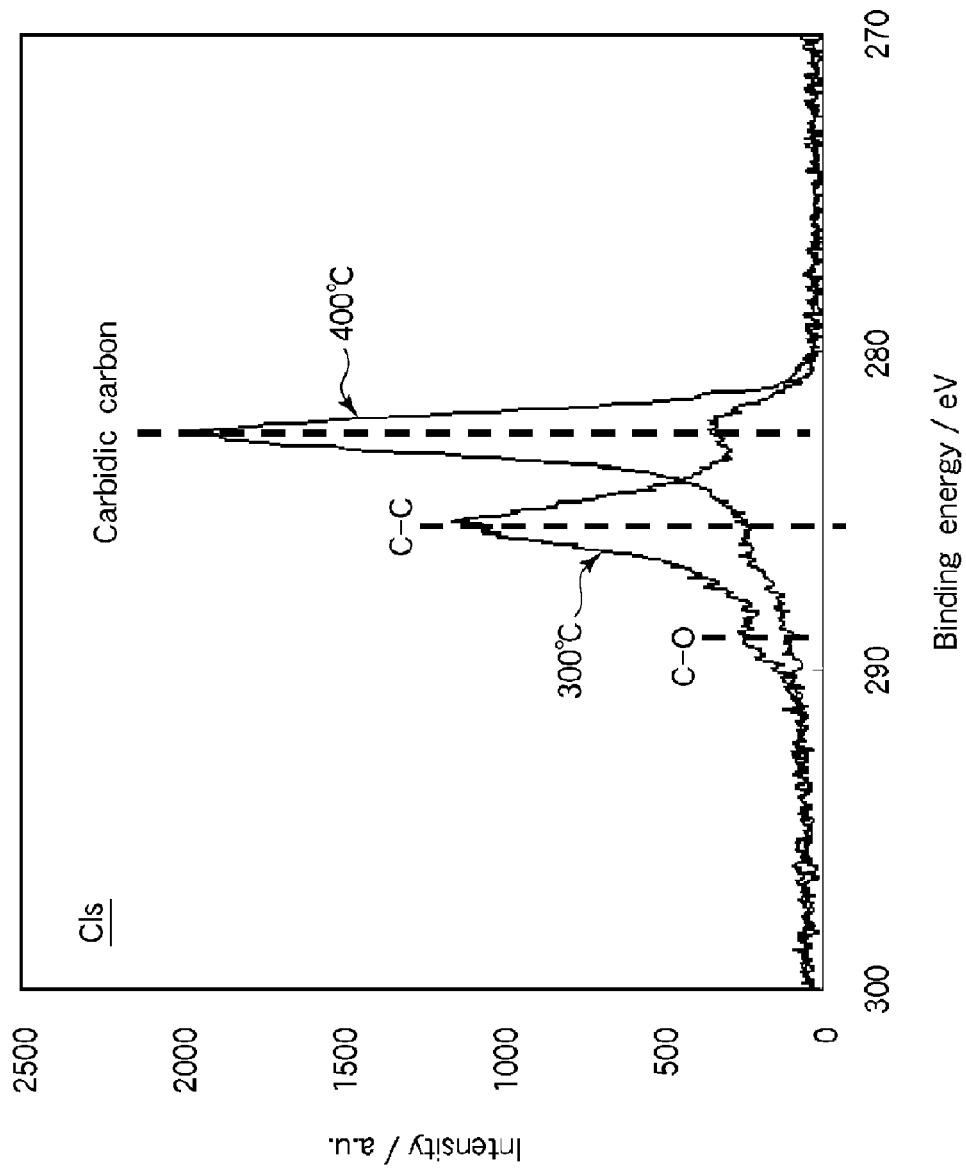
FIG. 5 is a diagram showing an analysis result of a chemical binding state of a C1s peak.

In order to investigate the reason for the improvement of the adhesivity, the manganese oxide films 103 formed at the film forming temperatures of about 300° C. and about 400° C. are analyzed. In the present embodiment, the gas of the manganese-containing organic compound is used for forming the manganese oxide films 103. Thus, it is expected that carbon (C) may have certain influence on the adhesivity. Accordingly, chemical binding states of C1s (carbon) peaks are analyzed by an X-ray photoelectron spectroscopy (XPS) method. FIG. 5 shows an analysis result of the chemical binding states of C1s peaks.

In FIG. 5, there are provided C1s XPS spectra of the samples 105 formed at the film forming temperatures of about 300° C., and about 400° C. (without being subjected to an annealing process).

As shown by the XPS spectrum, peaks of C—C, C—O/C=O, and carbidic carbon are observed in case of the sample 105 formed at the temperature of about 300° C.

Meanwhile, only peaks of carbidic carbon and C—C are observed in case of the sample 105 formed at the temperature of about 400° C. Further, a peak intensity ratio (I carbidic/I carbon total) of the sample 105 formed at the temperature of about 300° C. is found to be higher than that of the sample 105 formed at the temperature of about 400° C.

From these results, it is assumed that presence of carbidic carbon may be one of the causes of deterioration of adhesive strength between the manganese oxide film 103 and the copper film 104.

Figure 6:
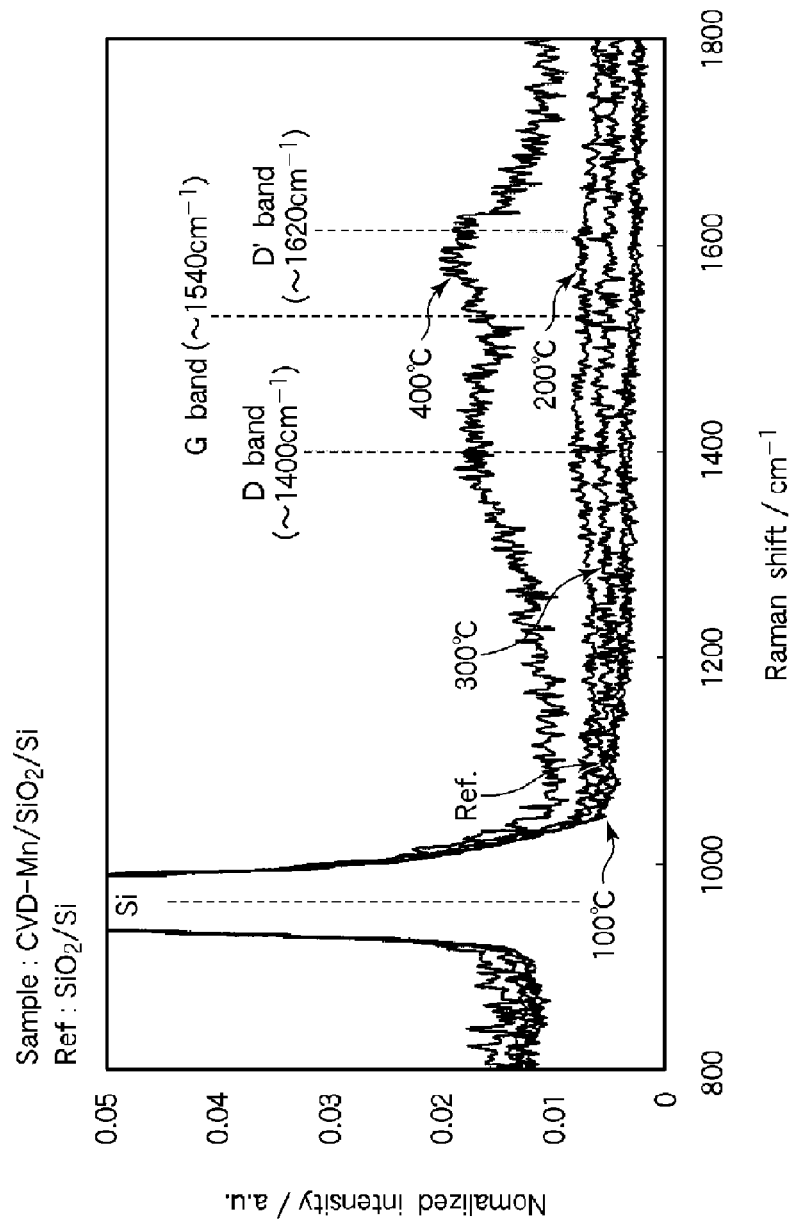
FIG. 6 is a diagram showing an analysis result of a surface binding state of a manganese oxide film.

Furthermore, surface binding state of the manganese oxide films 103 is analyzed by a Raman spectroscopy method. FIG. 6 shows an analysis result of the surface binding state of the manganese oxide films 103.

FIG. 6 provides Raman spectroscopy results of the samples 105 formed at the film forming temperatures of about 100° C. to about 400° C. (without being subjected to an annealing process).

As can be seen by Raman spectra of the samples 105 formed at the temperatures of about 100° C. to about 300° C., no notable peak originating from carbon is observed in case of the samples formed at the temperature equal to or lower than about 300° C. In contrast, in case of the sample 105 formed at about 400° C., notable peaks (D, G and D' bands) originating from carbon (including amorphous carbon) are observed.

That is, in order to enhance the adhesive strength between the manganese oxide film 103 and the copper film 104, carbidic carbon and/or amorphous carbon needs to be reduced.

(Change in the State of the Manganese Oxide Film Depending on the Film Forming Temperature)

As depicted in FIG. 5, based on the analysis result by the XPS method, it is deemed that a state of a manganese oxide film may be changed as follows depending on a film forming temperature thereof. For experiment, $(EtCp)_2Mn$ is used as the gas of the manganese-containing organic compound. FIGS. 7 to 10 provide experiment results by an angle-resolved X-ray photoelectron spectroscopy method.

(Film Forming Temperature of About 100° C.)

Figure 7:
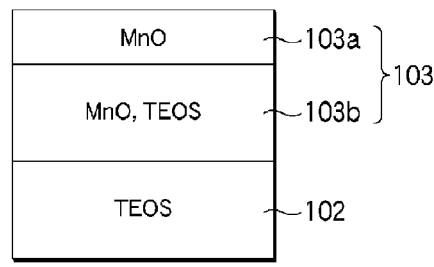
FIG. 7 is a cross sectional view schematically showing a state of a manganese oxide film when a film forming temperature is about 100° C.

As shown in FIG. 7, at the film forming temperature of about 100° C., the manganese oxide film 103 formed on the plasma TEOS film 102 may include a mixed layer 103b of MnO and TEOS ($SiO_x$); and a MnO layer 103a on a top surface thereof.

(Film Forming Temperature of About 200° C.)

Figure 8:
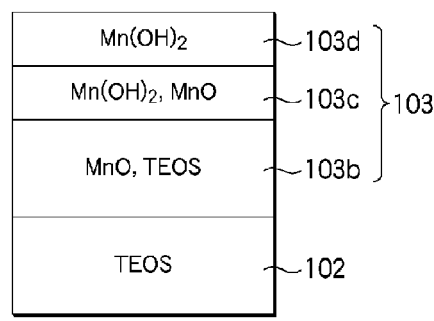
FIG. 8 is a cross sectional view schematically showing a state of a manganese oxide film when a film forming temperature is about 200° C.

As depicted in FIG. 8, at the film forming temperature of about 200° C., the manganese oxide film 103 formed on the plasma TEOS film 102 may include a mixed layer 103b of MnO and TEOS ($SiO_x$) on the plasma TEOS layer 102; a mixed layer 103c of $Mn(OH)_2$ and MnO on the mixed layer 103b; and a $Mn(OH)_2$ layer 103d on a top surface thereof.

(Film Forming Temperature of About 300° C.)

Figure 9:
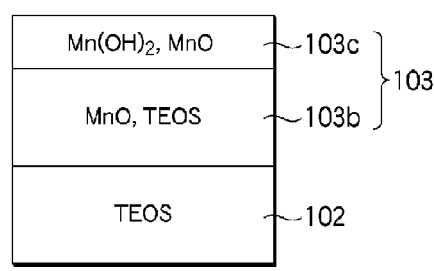
FIG. 9 is a cross sectional view schematically showing a state of a manganese oxide film when a film forming temperature is about 300° C.

As depicted in FIG. 9, at the film forming temperature of about 300° C., the manganese oxide film 103 formed on the plasma TEOS film 102 may include a mixed layer 103b of MnO and TEOS ($SiO_x$) on the plasma TEOS film 102; and a mixed layer 103c of $Mn(OH)_2$ and MnO on a top surface thereof.

(Film Forming Temperature of About 400° C.)

Figure 10:
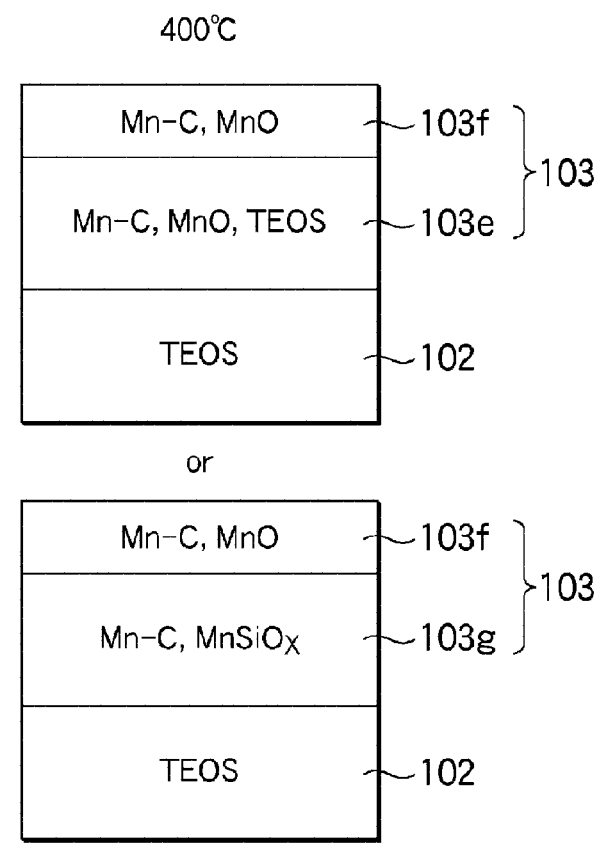
FIG. 10 is a cross sectional view schematically showing a state of a manganese oxide film when a film forming temperature is about 400° C.

As depicted in FIG. 10, at the film forming temperature of about 400° C., the manganese oxide film 103 formed on the plasma TEOS film 102 may include a mixed layer 103e of Mn—C, MnO and TEOS ($SiO_x$) on the plasma TEOS layer 102; and a mixed layer 103f of Mn—C and MnO on a top surface thereof. Alternatively, the manganese oxide film 103 may include a mixed layer 103g of Mn—C and $MnSiO_x$ formed on the plasma TEOS film 102; and a mixed layer 103f of Mn—C and MnO formed on a top surface thereof.

As stated above, by setting the film forming temperature for forming the manganese oxide film 103 to be equal to or higher than about 100° C. and lower than about 400° C., most of Mn—C can be removed from the manganese oxide film 103. As a result, the manganese oxide film 103 having high adhesivity to copper can be obtained.

(Carbon Concentration in the Manganese Oxide Film)

Subsequently, a carbon concentration in the manganese oxide film 103 is measured by secondary ion mass spectrometry (SIMS).

Figure 11:
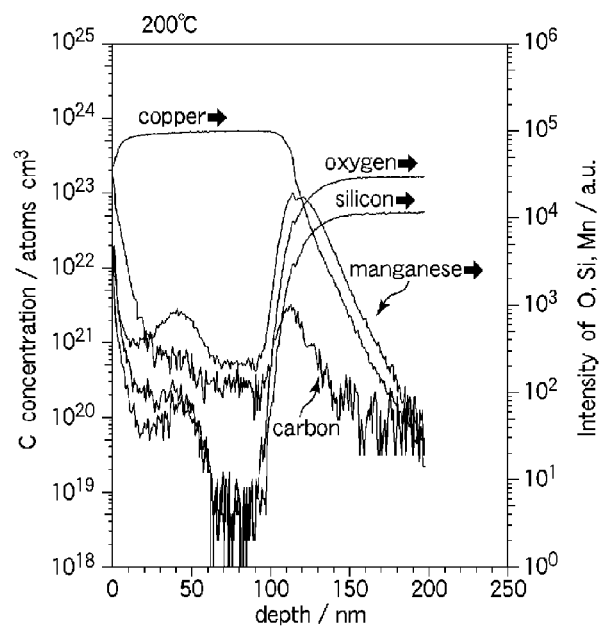
FIG. 11 is a diagram showing a result of a front side SIMS measurement on a sample formed at a film forming temperature of about 200° C.
Figure 12:
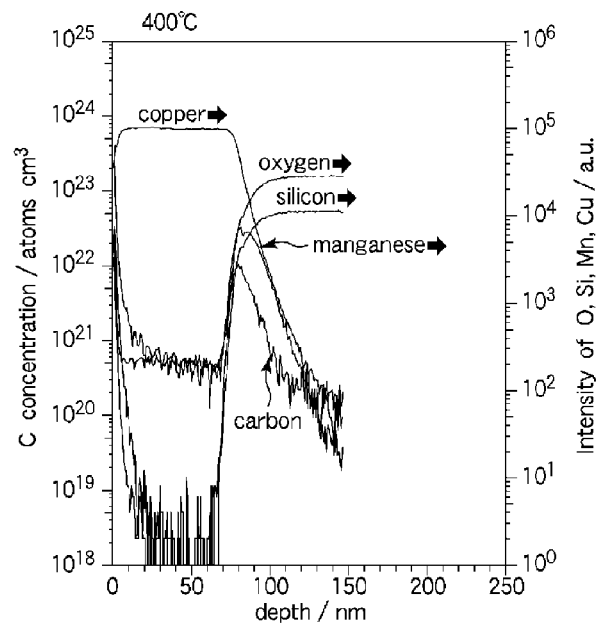
FIG. 12 is a diagram showing a result of a front side SIMS measurement on a sample formed at a film forming temperature of about 400° C.

The measurement is carried out by irradiating primary ions on a surface of the copper film 104 (front side SIMS). FIG. 11 shows a measurement result of the sample formed at the temperature of about 200° C., and FIG. 12 shows a measurement result of the sample 105 formed at the temperature of about 400° C. Here, the temperatures of about 200° C. and about 400° C. are film forming temperatures set for forming manganese oxide films 103. Further, a carbon concentration shown in each of FIGS. 11 and 12 is corrected by using a $SiO_2$ standard sample.

As depicted in FIGS. 11 and 12, a carbon concentration of the sample 105 formed at about 400° C. is higher than that of the sample 105 formed at about 200° C. In the present example, a peak of carbon concentration in the manganese oxide film 103 of the sample 105 formed at about 400° C. is about $1\times10^{22}$ atoms/cm$^3$ (FIG. 12), whereas a peak of carbon concentration in the manganese oxide film 103 of the sample 105 formed at about 200° C. is about $4\times10^{21}$ atoms/cm$^3$ (FIG. 11).

As can be seen from these results, by setting the peak of carbon concentration in the manganese oxide film 103 to be equal to or smaller than about $3\times10^{22}$ atoms/cm$^3$, desirably, equal to or smaller than about $1\times10^{22}$ atoms/cm$^3$, it may be possible to form the manganese oxide film 103 having high adhesivity to the copper film 104.

(Relationship Between a Film Forming Temperature and Concentrations of Carbon and Manganese in a Manganese Oxide Film)

Subsequently, a relationship between concentrations of carbon and manganese in a manganese oxide film 103 and a film forming temperature for forming the manganese oxide film 103 will be discussed. Experiment data to be described below are obtained from another experiment different from the above-described experiment.

(Carbon Concentration)

Figure 13:
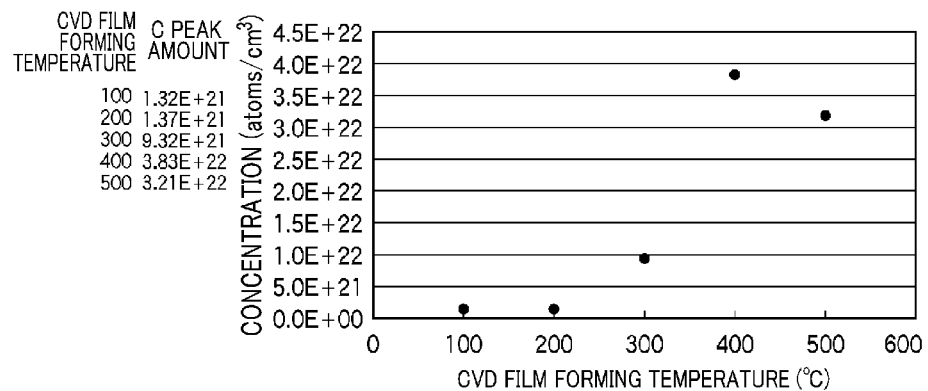
FIG. 13 is a diagram showing a relationship between a carbon concentration in a manganese oxide film and a film forming temperature.

FIG. 13 shows a relationship between a carbon concentration in a manganese oxide film and a film forming temperature thereof. Further, the carbon concentration shown in FIG. 13 is corrected by using a $SiO_2$ standard sample.

As shown in FIG. 13, carbon concentrations in manganese oxide films formed at different film forming temperatures are as follows.

Figure 15:
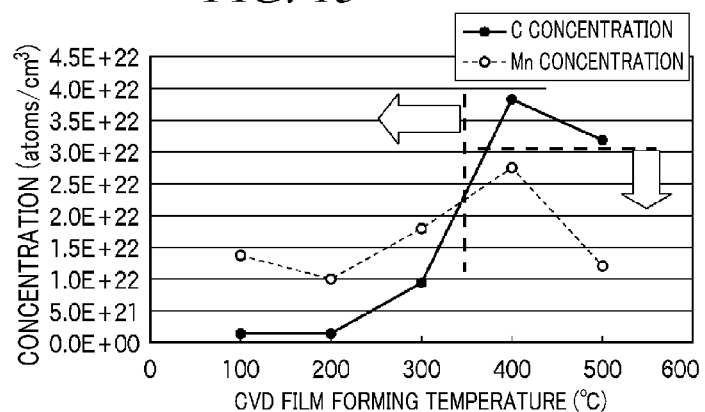
FIG. 15 is a diagram showing a relationship between a carbon concentration and a manganese concentration in a manganese oxide film and a film forming temperature.

Film forming temperature 100° C.: $1.32\times10^{21}$ atoms/cm$^3$
Film forming temperature 200° C.: $1.37\times10^{21}$ atoms/cm$^3$
Film forming temperature 300° C.: $9.32\times10^{21}$ atoms/cm$^3$
Film forming temperature 400° C.: $3.83\times10^{22}$ atoms/cm$^3$
Film forming temperature 500° C.: $3.21\times10^{22}$ atoms/cm$^3$ As shown in FIG. 4, the copper film 104 may not be peeled off at a film forming temperature lower than about 400° C., but may be peeled off at a film forming temperature equal to or higher than about 400° C. As can be seen from this result, it may be desirable to set the carbon concentration in the manganese oxide film 103 to be equal to or smaller than about $3\times10^{22}$ atoms/cm$^3$ in order to improve adhesive strength between the manganese oxide film 103 and the copper film 104, as depicted in FIG. 15.

(Manganese Concentration)

Figure 14:
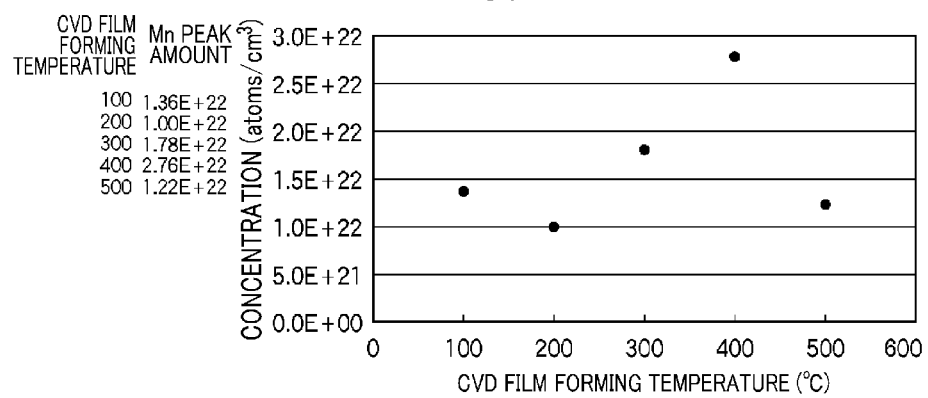
FIG. 14 is a diagram showing a relationship between a manganese concentration in a manganese oxide film and a film forming temperature.

FIG. 14 shows a relationship between a manganese concentration in a manganese oxide film and a film forming temperature thereof. Further, the manganese concentration shown in FIG. 14 is corrected by using a $SiO_2$ standard sample.

As depicted in FIG. 14, manganese concentrations in manganese oxide films formed at the different film forming temperatures are as follows.

Film forming temperature 100° C.: $1.36\times10^{22}$ atoms/cm$^3$
Film forming temperature 200° C.: $1.00\times10^{22}$ atoms/cm$^3$
Film forming temperature 300° C.: $1.78\times10^{22}$ atoms/cm$^3$
Film forming temperature 400° C.: $2.76\times10^{22}$ atoms/cm$^3$
Film forming temperature 500° C.: $1.22\times10^{22}$ atoms/cm$^3$ Likewise, as shown in FIG. 4, the copper film 104 may not be peeled off at a film forming temperature lower than about 400° C., but may be peeled off at a film forming temperature equal to or higher than about 400° C. As can be seen from this result, it may be desirable to set a ratio between a carbon concentration and a manganese concentration in the manganese oxide film 103 to be equal to or less than about 1:1 in order to improve adhesive strength between the manganese oxide film 103 and the copper film 104, as depicted in FIG. 15. Here, the ratio between the carbon concentration and the manganese concentration is "carbon concentration manganese concentration," and, when the ratio is equal to or smaller than 1:1, it implies that the carbon concentration is equal to or smaller than 1 when the manganese concentration is 1.

(Barrier Property)

As stated above, in accordance with the embodiment of the present disclosure, the manganese oxide film 103 having high adhesivity to copper can be formed. However, unless the manganese oxide film 103 has good barrier property against copper, the manganese oxide film 103 may not be used as a barrier layer.

In this regard, it is investigated by the backside secondary ion mass spectrometry whether diffusion of copper is suppressed.

Figure 16:
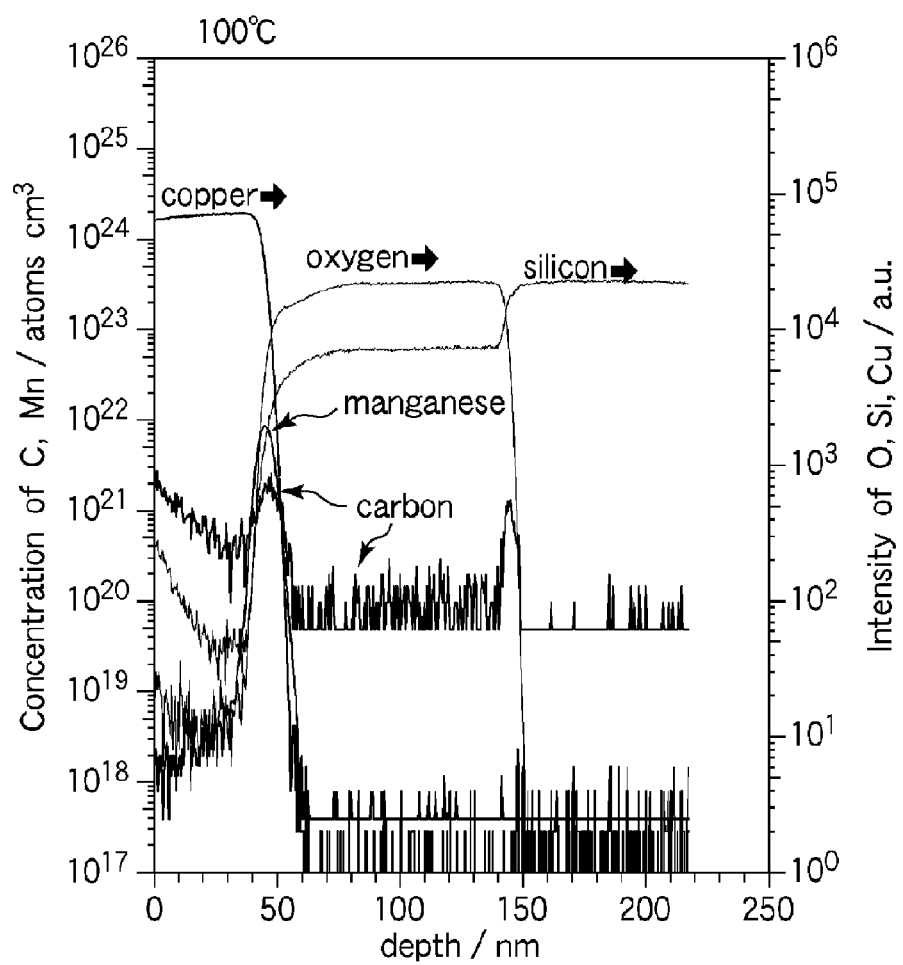
FIG. 16 is a diagram showing a result of a backside SIMS measurement on a sample formed at a film forming temperature of about 100° C.

For the measurement, a rear surface of a silicon wafer 101 is polished to reduce a thickness thereof. Then, primary ions are irradiated to a surface of the silicon wafer 101 having a reduced thickness (backside SIMS). FIG. 16 shows a measurement result. A film forming temperature for forming a manganese oxide film 103 is about 100° C. Further, each concentration is corrected by using a $SiO_2$ standard sample.

As can be seen from FIG. 16, copper hardly diffuses into the plasma TEOS film 102 and the silicon wafer 101. That is, the diffusion of the copper may be suppressed by the manganese oxide film 103.

From the above result, it is also proved that the manganese oxide film 103 in accordance with the present disclosure has good barrier property against the copper.

As described above, in accordance with the present embodiment, it may be possible to form the manganese oxide film 103 having high adhesivity to the copper and high barrier property against the copper.

(Application Example to a Semiconductor Device)

FIGS. 17A to 17F are cross sectional views illustrating an example semiconductor device manufacturing method using the manganese oxide film forming method in accordance with the embodiment of the present disclosure. In FIGS. 17A to 17F, illustration of a semiconductor substrate (e.g., a silicon wafer) is omitted, and only a first interlayer insulating film formed on the semiconductor substrate and structures on the first interlayer insulating film are shown for the simplicity of illustration.

(First Metal Wiring Forming Process)

Figure 17A:
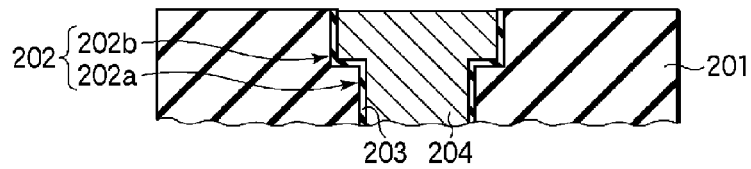
FIG. 17A is a cross sectional view illustrating an example of a semiconductor device manufacturing method using the manganese oxide film forming method in accordance with the embodiment of the present disclosure.

First, as shown in FIG. 17A, a recess 202 having a via hole (or a contact hole) 202a and a groove 202b may be formed in a first interlayer insulating film 201 by a dual damascene method. The via hole 202a may reach a non-illustrated underlying conductive layer. The groove 202b may serve as a pattern for forming a first metal wiring. The first interlayer insulating film 201 may be made of an oxygen-containing insulating material such as, but not limited to:

an insulating material containing silicon (Si) and oxygen (O) (e.g., a $SiO_x$-based film)

an insulating material containing silicon (Si), oxygen (O), and carbon (C) (e.g., a SiOC-based film)

an insulating material containing silicon (Si), oxygen (O), and fluorine (F) (e.g., a SiOF-based film)

an insulating material containing silicon (Si), oxygen (O), carbon (C), and hydrogen (H) (e.g., a SiCOH-based film). Further, a multiple number of insulating films including these insulating materials may be layered. In the present embodiment, a silicon oxide (SiOx)-based insulating material, e.g., plasma TEOS is used. Subsequently, a barrier layer 203 may be formed in the recess 202, and then, a first metal wiring 204 may be formed.

Figure 17B:
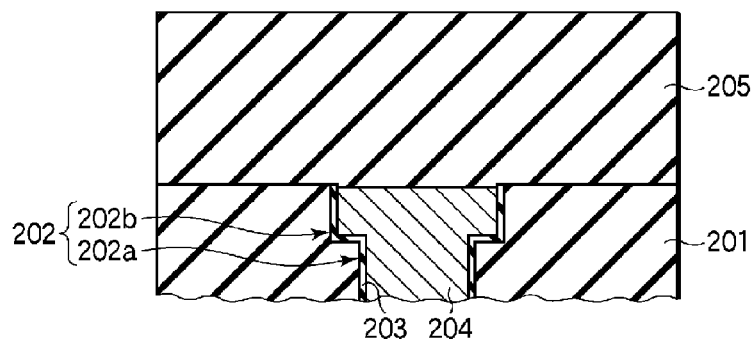
FIG. 17B is a cross sectional view illustrating the example of the semiconductor device manufacturing method using the manganese oxide film forming method in accordance with the embodiment of the present disclosure.

Thereafter, as illustrated in FIG. 17B, a second interlayer insulating film 205 may be formed on the first interlayer insulating film 201 in which the first metal wiring 204 may be formed. By way of example, the second interlayer insulating film 205 may be made of the same material as that of the first interlayer insulating film 201.

Figure 17C:
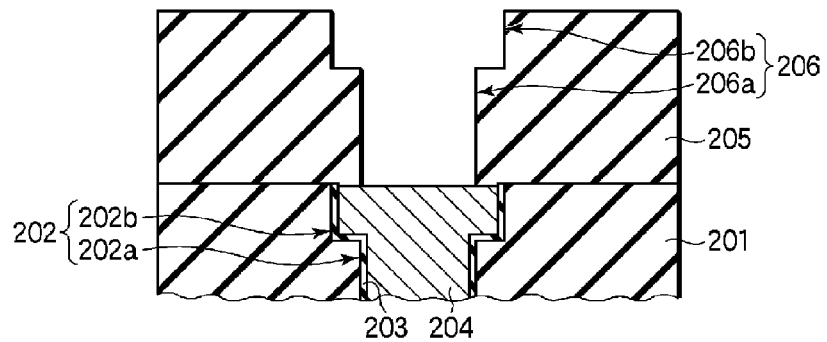
FIG. 17C is a cross sectional view illustrating the example of the semiconductor device manufacturing method using the manganese oxide film forming method in accordance with the embodiment of the present disclosure.

Subsequently, as illustrated in FIG. 17C, by using a dual damascene method, a recess 206 having a via hole 206a and a groove 206b may be formed in the second interlayer insulating film 205. The via hole 206a may reach the first metal wiring 204 and the groove 206b may serve as a pattern for forming a second metal wiring.

Figure 17D:
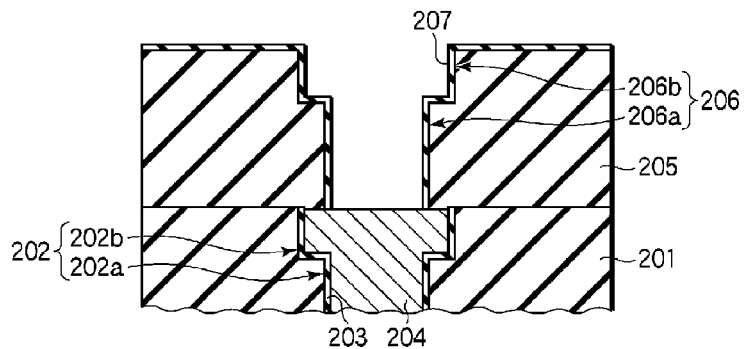
FIG. 17D is a cross sectional view illustrating the example of the semiconductor device manufacturing method using the manganese oxide film forming method in accordance with the embodiment of the present disclosure.

Thereafter, as illustrated in FIG. 17D, the silicon wafer including thereon the second interlayer insulating film 205 having the recess 206 may be transferred into the transfer chamber 21a of the film forming system 1 shown in FIG. 1, for example. Then, a manganese oxide film to be used as a barrier layer 207 may be formed by a thermal CVD method at a film forming temperature equal to or higher than about 100° C. and lower than about 400° C. as described above. At this time, oxygen and/or moisture in the second interlayer insulating film 205 may be used as an oxidizing agent for the barrier layer 207 made of the manganese oxide film. Further, like the barrier layer 207, the barrier layer 203 may also be formed by the thermal CVD method at a film forming temperature equal to or higher than about 100° C. and lower than about 400° C. In such a case, oxygen and/or moisture in the first interlayer insulating film 201 may be used as an oxidizing agent for the barrier layer 203.

Figure 17E:
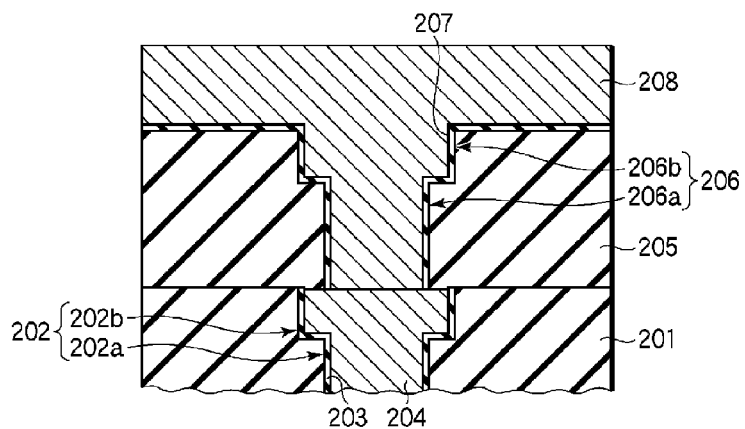
FIG. 17E is a cross sectional view illustrating the example of the semiconductor device manufacturing method using the manganese oxide film forming method in accordance with the embodiment of the present disclosure.

Afterward, as illustrated in FIG. 17E, the silicon wafer having thereon the barrier layer 207 may be transferred into the processing chamber 21b of the film forming system 1 shown in FIG. 1 via the transfer chamber 22, for example. In the present embodiment, the transfer chamber 22 can be maintained in a vacuum state and the silicon wafer can be transferred therein while isolated from the atmosphere, as described above with reference to FIG. 1. Accordingly, when the silicon wafer is transferred from the processing chamber 21a to the processing chamber 21b, the silicon wafer may not be exposed to the atmosphere. Then, a copper film or a copper alloy film containing copper may be formed on the barrier layer 207 by using a PVD method such as a sputtering method. The copper film or the copper alloy film may be used as a second metal wiring 208. Here, the copper film 208 may be formed by a CVD method, as well as by the PVD method. Alternatively, it may be also possible to form the copper film 208 by forming a thin copper layer (seed layer) by the PVD method and then plating a thick copper film on the thin copper film through the use of an electroplating method or an electroless plating method.

Figure 17F:
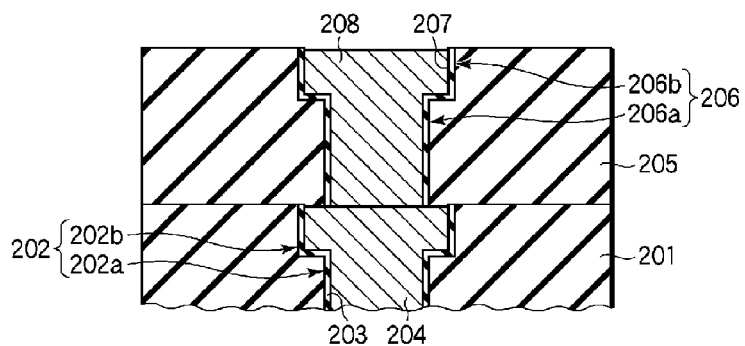
FIG. 17F is a cross sectional view illustrating the example of the semiconductor device manufacturing method using the manganese oxide film forming method in accordance with the embodiment of the present disclosure.

Afterward, as depicted in FIG. 17F, the silicon wafer having thereon the copper film or copper alloy film serving as the second metal wiring 208 may be unloaded from the film forming system 1. Then, the silicon wafer may be transferred into a chemical mechanism polishing (CMP) apparatus. In the CMP apparatus, the copper film or copper alloy film may be polished by a CMP method, so that the copper film or copper alloy film protruded from the recess 206 may be removed. In this way, the second metal wiring 208 may be formed.

As described above, the manganese oxide film forming method in accordance with the embodiment of the present disclosure can be applied to the manufacture method of the semiconductor device.

Moreover, in the semiconductor device formed by this manufacturing method, the peak of carbon concentration in the barrier layer (diffusion barrier film) 207 may be equal to or smaller than about $3 \times 10^{22}$ atoms/cm$^3$, and, desirably, may be equal to or smaller than about $1 \times 10^{22}$ atoms/cm$^3$.

The present disclosure has been described with respect to the embodiment. However, the present disclosure may not be limited thereto but can be modified in various ways without departing from the spirit of the disclosure. Furthermore, the above-described embodiment is nothing more than an example.

By way of example, in the above-described embodiment, the manganese oxide film is formed as the barrier film on the interlayer insulating film formed on the semiconductor wafer and having the recess for burying therein the wiring. However, the manganese oxide film may serve as, e.g., a dielectric material of a capacitor having a copper film or copper alloy film as an electrode. Further, the manganese oxide film may serve as a gate insulating film of a transistor.

Moreover, in the above-described embodiment, in order to form the copper film or copper alloy film serving as the second metal wiring 208 on the manganese oxide film, serving as the barrier layer 207, formed at the film forming temperature equal to or higher than about 100° C. and lower than about 400° C., the cluster-tool type film forming system 1 shown in FIG. 1 is used. In the film forming system 1, the silicon wafer is transferred from the processing chamber 21a to the processing chamber 21b via the transfer chamber 22 without being exposed to the atmosphere (In-situ process: no exposure to the atmosphere). The transfer chamber 22 is capable of maintaining a vacuum therein and allows the silicon wafer to be transferred therein without being exposed to the atmosphere.

However, the copper film or the copper alloy film serving as the second metal wiring 208 may be formed without using the cluster-tool type film forming system 1 as shown in FIG. 1.

When the cluster-tool type film forming system is not used, however, it is unavoidable that the silicon wafer is transferred into a film forming apparatus for forming a copper film or copper alloy film while the silicon wafer is exposed to the atmosphere (Ex-situ process: exposure to the atmosphere). That is, the manganese oxide film formed at the film forming temperature equal to or higher than about 100° C. and lower than about 400° C. may become exposed to the atmosphere. If the manganese oxide film is exposed to the atmosphere, there is a possibility that a surface of the manganese oxide film may be contaminated with dirt or organic materials floating in the atmosphere.

Such dirt or organic materials may include carbon.

As stated above, if there exists a great amount of carbon, it may be difficult to have high adhesivity. Thus, it may be desirable that dirt or organic materials including carbon are not attached to the manganese oxide film. That is, in order to form the copper film or copper alloy film on the manganese oxide film formed at the film forming temperature equal to or higher than about 100° C. and lower than about 400° C., it may be desirable to transfer the silicon wafer from a processing chamber for forming the manganese oxide film to a processing chamber for forming the copper film or the copper alloy film without exposing the manganese oxide film to the atmosphere. In this way, a manganese oxide film having high adhesivity to copper can be formed, as described above.

Moreover, the substrate may not be limited to the semiconductor wafer. By way of example, the substrate may be a glass substrate for use in the manufacture of a solar cell or a FPD.

In the present embodiment the copper or the copper alloy is used as the metal wiring. However, the metal wiring, i.e., the conductive material may include at least one selected from a group consisting of aluminum, copper, and silver.

In accordance with the present disclosure, it may be possible to provide a manganese oxide film forming method capable of forming a manganese oxide film having high adhesivity to Cu. Further, it may also be possible to provide a semiconductor device manufacturing method using the manganese oxide film forming method and a semiconductor device formed by this manufacturing method.

What is claimed is:

1. A manganese oxide film forming method for forming a manganese oxide film on an oxide film by supplying a manganese-containing gas onto the oxide film, the method comprising:
    setting a film forming temperature for forming the manganese oxide film to be equal to or higher than about 100° C. and lower than about 400° C., and
    forming the manganese oxide film by oxidizing the manganese-containing gas by using moisture included in the oxide film.

2. The manganese oxide film forming method of claim 1, wherein the manganese oxide film is formed by a thermal CVD method.

3. The manganese oxide film forming method of claim 1, wherein the manganese oxide film includes at least one of a MnO layer, a mixed layer of MnO and $SiO_x$, a mixed layer of $Mn(OH)_2$ and MnO, and a $Mn(OH)_2$ layer.

4. The manganese oxide film forming method of claim 1, wherein the oxide film is a silicon oxide film.

5. The manganese oxide film forming method of claim 1, wherein the manganese-containing gas is a gas of an organic compound containing manganese, and
the organic compound contains at least one selected from a group consisting of:
$(EtCp)_2Mn[=Mn(C_2H_5C_5H_4)_2]$
$Cp_2Mn[=Mn(C_5H_5)_2]$;
$(MeCp)_2Mn[=Mn(CH_3C_5H_4)_2]$;
$(i-PrCp)_2Mn[=Mn(C_3H_7C_5H_4)_2]$;
$MeCpMn(CO)_3[=(CH_3C_5H_4)Mn(CO)_3]$;
$(t-BuCp)_2Mn[=Mn(C_4H_9C_5H_4)_2]$;
$CH_3Mn(CO)_5$, $Mn(DPM)_3[=Mn(C_{11}H_{19}O_2)_3]$;
$Mn(DMPD)(EtCp)[=Mn(C_7H_{11}C_2H_5C_5H_4)]$;
$Mn(DPM)_2[=Mn(C_{11}H_{19}O_2)_2]$;
$Mn(acac)_2[=Mn(C_5H_7O_2)_2]$;
$Mn(acac)_3[=Mn(C_5H_7O_2)_3]$;
$Mn(hfac)_2[=Mn(C_5HF_6O_2)_3]$;
$((CH_3)_5Cp)_2Mn[=Mn((CH_3)_5C_5H_4)_2]$; and
$Mn(t-BuNC(CH_3)Nt-Bu)_2[=Mn(C_4H_9NC(CH_3)NC_4H_9)_2]$, which is a manganese acetamidinate compound.

6. A semiconductor device manufacturing method comprising:
    forming an interlayer insulating film including an oxide film on a substrate;
    forming a recess in the interlayer insulating film;
    forming a manganese oxide film on the interlayer insulating film by supplying a manganese-containing gas onto the interlayer insulting film having the recess at a film forming temperature equal to or higher than about 100° C. and lower than about 400° C.; and
    depositing a conductive material in the recess of the interlayer insulating film on which the manganese oxide film is formed in order to form an internal wiring,
    wherein in the forming of the manganese oxide film, the manganese oxide film is formed by oxidizing the manganese-containing gas by using moisture included in the oxide film included in the interlayer insulating film.

7. The semiconductor device manufacturing method of claim 6,
    wherein, from forming a manganese oxide film to depositing a conductive material in the recess of the interlayer insulating film on which the manganese oxide film is formed, the manganese oxide film is not exposed to the atmosphere.

8. The semiconductor device manufacturing method of claim 6,
wherein the conductive material includes at least one selected from a group consisting of aluminum, copper, and silver.

9. The semiconductor device manufacturing method of claim 6,
wherein the manganese oxide film is formed by a thermal CVD method.

10. The semiconductor device manufacturing method of claim 6,
wherein the interlayer insulating film is a silicon oxide film.

11. The semiconductor device manufacturing method of claim 6,
wherein the manganese-containing gas is a gas of an organic compound containing manganese, and
the organic compound contains at least one selected from a group consisting of:
$(EtCp)_2Mn[=Mn(C_2H_5C_5H_4)_2]$
$Cp_2Mn[=Mn(C_5H_5)_2];$
$(MeCp)_2Mn[=Mn(CH_3C_5H_4)_2];$
$(i\text{-}PrCp)_2Mn[=Mn(C_3H_7C_5H_4)_2];$
$MeCpMn(CO)_3[=(CH_3C_5H_4)Mn(CO)_3];$
$(t\text{-}BuCp)_2Mn[=Mn(C_4H_9C_5H_4)_2];$
$CH_3Mn(CO)_5, Mn(DPM)_3[=Mn(C_{ii}H_{19}O_2)_3];$
$Mn(DMPD)(EtCp)[=Mn(C_7H_{11}C_2H_5C_5H_4)];$
$Mn(DPM)_2[=Mn(C_{11}H_{19}O_2)_2];$
$Mn(acac)_2[=Mn(C_5H_7O_2)_2];$
$Mn(acac)_3[=Mn(C_5H_7O_2)_3];$
$Mn(hfac)_2[=Mn(C_5HF_6O_2)_3];$
$((CH_3)_5Cp)_2Mn[=Mn((CH_3)_5C_5H_4)_2];$ and
$Mn(t\text{-}BuNC(CH_3)Nt\text{-}Bu)_2[=Mn(C_4H_9NC(CH_3)NC_4H_9)_2]$, which is a manganese acetamidinate compound.

12. A semiconductor device having a manganese oxide film formed by the manganese oxide film forming method of claim 1, the manganese oxide film containing manganese, oxygen, and carbon,
wherein a peak concentration of the carbon in the manganese oxide film is equal to or smaller than about $3\times10^{22}$ atoms/cm$^3$.

13. The semiconductor device of claim 12,
wherein a peak concentration of the carbon in the diffusion barrier layer is equal to or smaller than about $1\times10^{22}$ atoms/cm$^3$.

14. A semiconductor device having a manganese oxide film formed by the manganese oxide film forming method of claim 1, the manganese oxide film containing manganese, oxygen, and carbon,
wherein a ratio between a carbon concentration and a manganese concentration in the manganese oxide film is equal to or smaller than about 1:1.

15. The manganese oxide film forming method of claim 1, wherein the manganese oxide film is formed by oxidizing the manganese-containing gas by further using oxygen included in the oxide film.

16. The semiconductor device manufacturing method of claim 6, wherein the manganese oxide film is formed by oxidizing the manganese-containing gas by further using oxygen included in the oxide film included in the interlayer insulating film.

17. The manganese oxide film forming method of claim 1, wherein the film forming temperature for forming the manganese oxide film is equal to or higher than about 200° C. and lower than about 300° C., and
the manganese oxide film includes a Mn(OH)$_2$ layer.

18. The semiconductor device manufacturing method of claim 6, wherein the film forming temperature for forming the manganese oxide film is equal to or higher than about 200° C. and lower than about 300° C., and
the manganese oxide film includes a Mn(OH)$_2$ layer.

* * * * *

UNITED STATES PATENT AND TRADEMARK OFFICE
CERTIFICATE OF CORRECTION

PATENT NO. : 8,859,421 B2
APPLICATION NO. : 13/267227
DATED : October 14, 2014
INVENTOR(S) : Koji Neishi et al.

It is certified that error appears in the above-identified patent and that said Letters Patent is hereby corrected as shown below:

In the Claims,

Column 15, line 29; Please delete "$[Mn(C_{ii}H_{19}O_2)_3]$;" and add -- $[Mn(C_{11}H_{19}O_2)_3]$; --

Signed and Sealed this
Fifth Day of May, 2015

Michelle K. Lee
*Director of the United States Patent and Trademark Office*